(12) United States Patent
Fukuzumi

(10) Patent No.: US 6,970,376 B1
(45) Date of Patent: Nov. 29, 2005

(54) MAGNETIC RANDOM ACCESS MEMORY AND METHOD OF WRITING DATA IN MAGNETIC RANDOM ACCESS MEMORY

(75) Inventor: Yoshiaki Fukuzumi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/899,057

(22) Filed: Jul. 27, 2004

(30) Foreign Application Priority Data

May 17, 2004 (JP) .............................. 2004-146441

(51) Int. Cl.[7] .......................................... G11C 11/00
(52) U.S. Cl. ...................... 365/158; 365/171; 365/173; 257/684
(58) Field of Search ............................... 365/158, 171, 365/173; 257/684

(56) References Cited

U.S. PATENT DOCUMENTS 6,797,536 B2 * 9/2004 Yoda et al. ................... 438/48

2005/0018478 A1 * 1/2005 Nagase et al. .............. 365/171

* cited by examiner

*Primary Examiner*—Richard Elms
*Assistant Examiner*—N. Nguyen
(74) *Attorney, Agent, or Firm*—Oblon, Spivak, McClelland, Maier & Neustadt, P.C.

(57) ABSTRACT

A magnetic random access memory includes first and second write wirings extended in first and second directions, a magneto-resistance element located between the first and second write wirings, a first yoke layer provided on a first outer surface and both sides of the first write wiring and being formed of a magnetic layer, and a second yoke layer provided on a second outer surface and both sides of the second write wiring and being formed of a magnetic layer, wherein the magneto-resistance element has a recording layer formed of a ferromagnetic substance and comprising a first surface and a second surface, a first ferromagnetic layer provided on the first surface, a second ferromagnetic layer provided on the second surface, a first nonmagnetic layer provided between the recording layer and the first ferromagnetic layer, and a second nonmagnetic layer provided between the recording layer and the second ferromagnetic layer.

20 Claims, 10 Drawing Sheets

MAGNETIC RANDOM ACCESS MEMORY AND METHOD OF WRITING DATA IN MAGNETIC RANDOM ACCESS MEMORY

CROSS-REFERENCE TO RELATED APPLICATIONS

This application is based upon and claims the benefit of priority from prior Japanese Patent Application No. 2004-146441, filed May 17, 2004, the entire contents of which are incorporated herein by reference.

BACKGROUND OF THE INVENTION

1. Field of the Invention

The present invention relates to a magnetic random access memory (MRAM) comprising a magneto-resistance element and a method of writing data in the magnetic random access memory.

2. Description of the Related Art

In recent years, a magnetic random access memory (MRAM) utilizing the tunnel magneto-resistance (MRAM) effect has been proposed as a semiconductor memory.

In a memory cell of the MRAM, an MTJ (Magnetic Tunneling Junction) element is provided at each point of intersection between a bit line and a word line as an information storage element. If a data write is carried out, currents are allowed to flow through a selected bit line and a selected word line, respectively, to generate a composite magnetic field. Then, the composite magnetic field is used to write data in an MTJ element in the selected cell located at the point of intersection between the selected bit line and the selected word line. On the other hand, to read data from a memory cell, a read current is allowed to flow through the MTJ element in the selected cell. Then, "1" or "0" data is read on the basis of the change in the resistance of the magnetized state of the MTJ element.

In such an MRAM, when a data write is carried out, the write current magnetic field may affect semi-selected cells selected by one of the selected bit line and the selected bit line. Then, data may be erroneously written in the semi-selected cells. This is called a disturbance. The avoidance of disturbance is considered to be one of the most important objects in the development of MRAMs. However, an asteroid characteristic is sensitive to the shape of the MTJ element or the like. Accordingly, the fine-grained structure of the element may further significantly affect the asteroid characteristic. Thus, the number of miswrites in semi-selected cells increases with decreasing size of the element. Then, the disturbance becomes more serious. To avoid this problem, the write current must be increased in order to prevent miswrites in semi-selected cells. There are MRAMs based on a toggle system using a weakly coupled stacked recording layer. However, this system must also increase the write current.

BRIEF SUMMARY OF THE INVENTION

According to a first aspect of the present invention, there is provided a magnetic random access memory comprising a first write wiring extended in a first direction; a second write wiring extended in a second direction different from the first direction; a magneto-resistance element provided at a point of intersection of the first and second write wirings and located between the first and second write wirings; a first yoke layer provided on a first outer surface and both sides of the first write wiring and being formed of a magnetic layer, the first outer surface being opposite a first inner surface of the first write wiring facing the magneto-resistance ement; and a second yoke layer provided on a second outer surface and both sides of the second write wiring and being formed of a magnetic layer, the second outer surface being opposite a second inner surface of the second write wiring facing the magneto-resistance element, wherein the magneto-resistance element has a recording layer formed of a ferromagnetic substance and comprising a first surface and a second surface; a first ferromagnetic layer provided on the first surface of the recording layer; a second ferromagnetic layer provided on the second surface of the recording layer; a first nonmagnetic layer provided between the recording layer and the first ferromagnetic layer; and a second nonmagnetic layer provided between the recording layer and the second ferromagnetic layer.

According to a second aspect of the present invention, there is provided a method of writing data in a magnetic random access memory comprising a first write wiring extended in a first direction; a second write wiring extended in a second direction different from the first direction; a magneto-resistance element provided at a point of intersection of the first and second write wirings and located between the first and second write wirings; a first yoke layer provided on a first outer surface and both sides of the first write wiring and being formed of a magnetic layer, the first outer surface being opposite a first inner surface of the first write wiring facing the magneto-resistance element; and a second yoke layer provided on a second outer surface and both sides of the second write wiring and being formed of a magnetic layer, the second outer surface being opposite a second inner surface of the second write wiring facing the magneto-resistance element, the magneto-resistance element having a recording layer formed of a ferromagnetic substance and comprising a first surface and a second surface; a first ferromagnetic layer provided on the first surface of the recording layer; a second ferromagnetic layer provided on the second surface of the recording layer; a first nonmagnetic layer provided between the recording layer and the first ferromagnetic layer; and a second nonmagnetic layer provided between the recording layer and the second ferromagnetic layer wherein when data is written in the magneto-resistance element, first and second write currents flow through the first and second write wirings, respectively, to generate first and second magnetic fields, respectively, the first and second magnetic fields are applied to the first and second ferro-magnetic layers, respectively, to rotate the magnetizations in the first and second ferromagnetic layers, and a rotation of the magnetizations in the first and second ferromagnetic layers causes magnetostriction resulting in the first and second stresses, the first and second stresses being applied to the recording layer to rotate magnetization in the recording layer.

DETAILED DESCRIPTION OF THE INVENTION

Figure 1:
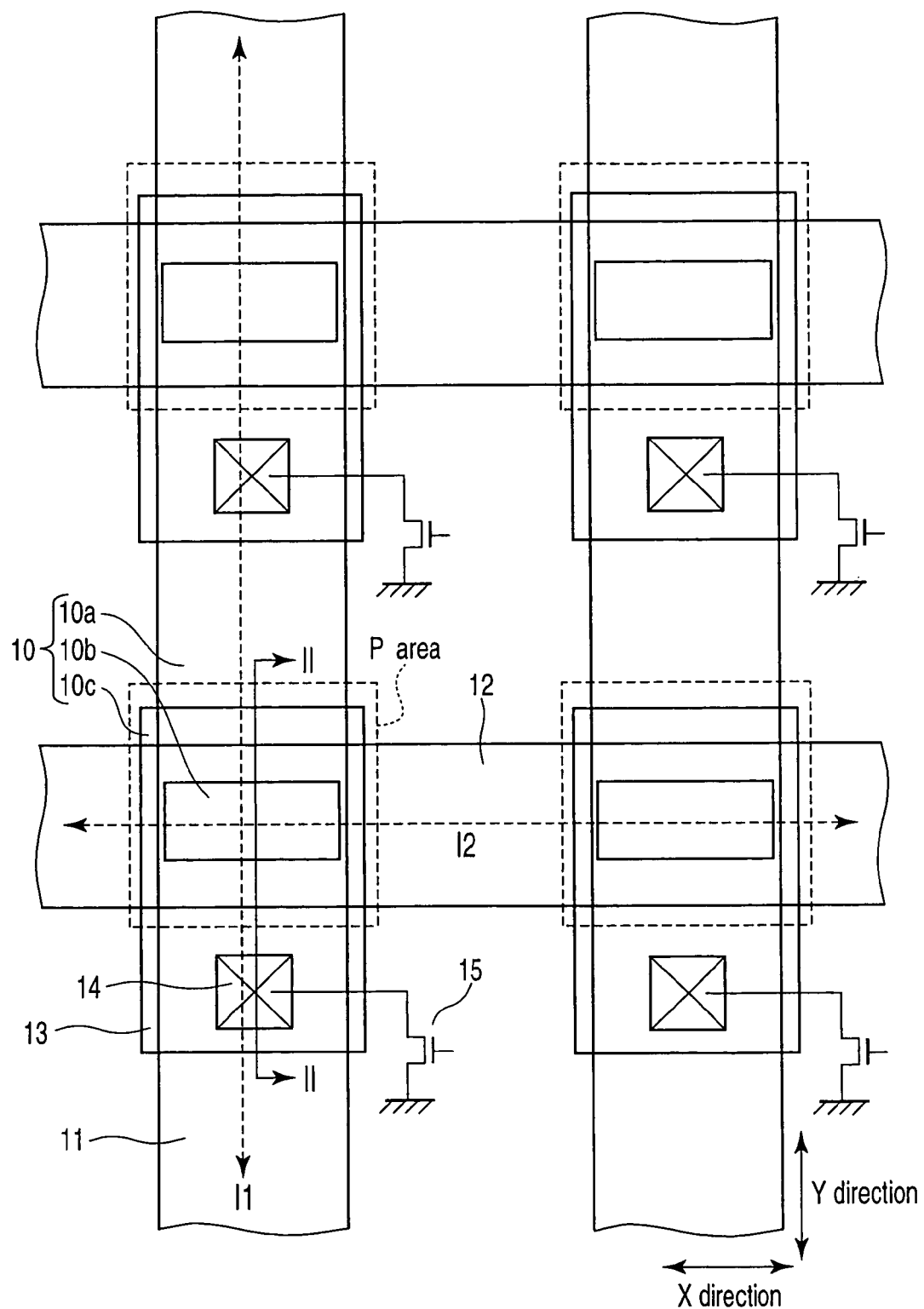
FIG. 1 is a schematic plan view showing a magnetic random access memory according to a first embodiment of the present invention.

Embodiments of the present invention will be described with reference to the drawings. In the description, common components are denoted by common reference numerals throughout the drawings.

First Embodiment

In a first embodiment, in an MTJ (Magnetic Tunnel Junction) element, ferromagnetic layers are provided over and under a recording layer, respectively, via nonmagnetic layers so that magnetostriction in the ferromagnetic layers can be transmitted to the recording layer. That is, toggle writes are carried out utilizing a magnetostriction interaction.

(1) Structure

Figure 2:
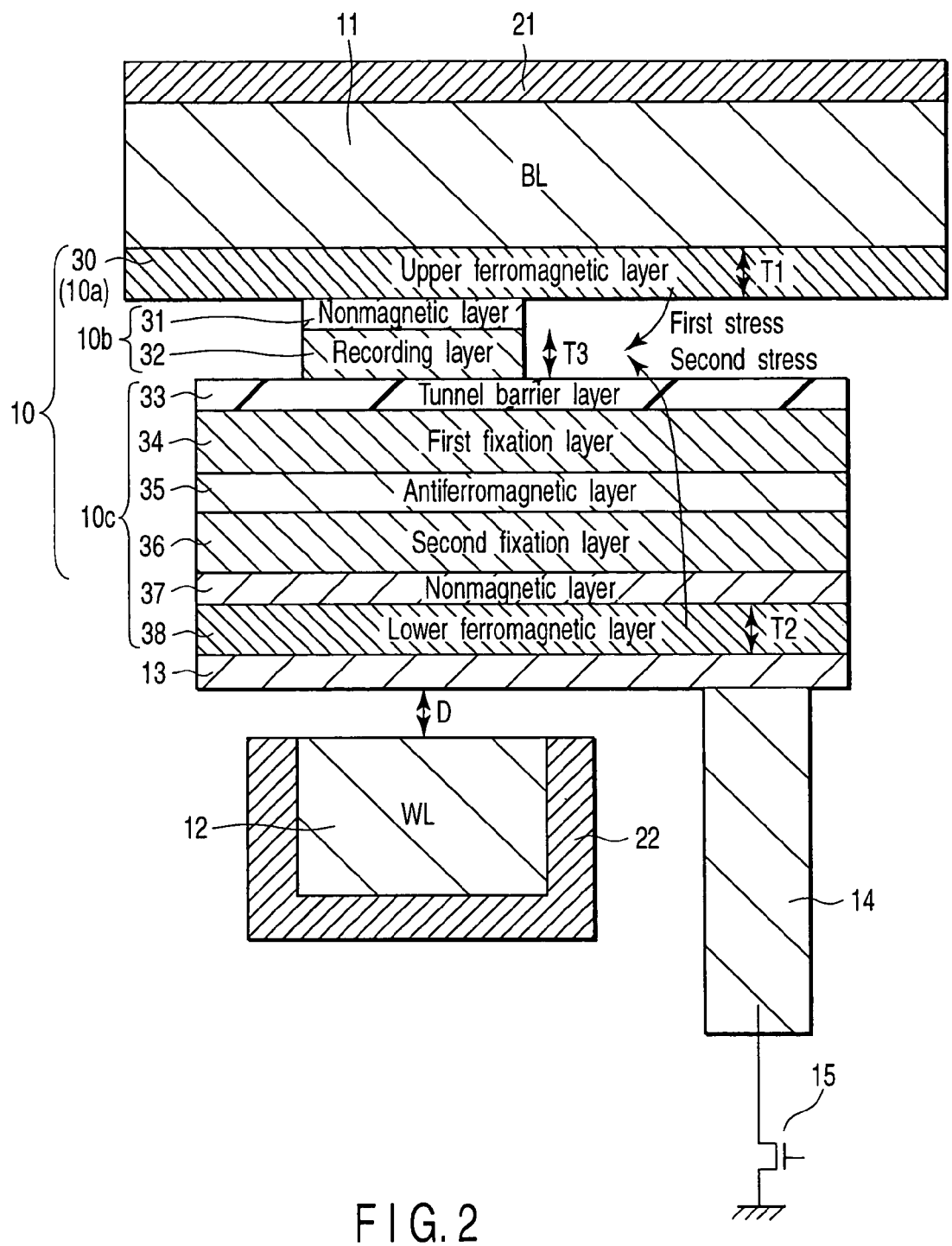
FIG. 2 is a sectional view of the magnetic random access memory taken along a line II—II in FIG. 1.
Figure 3:
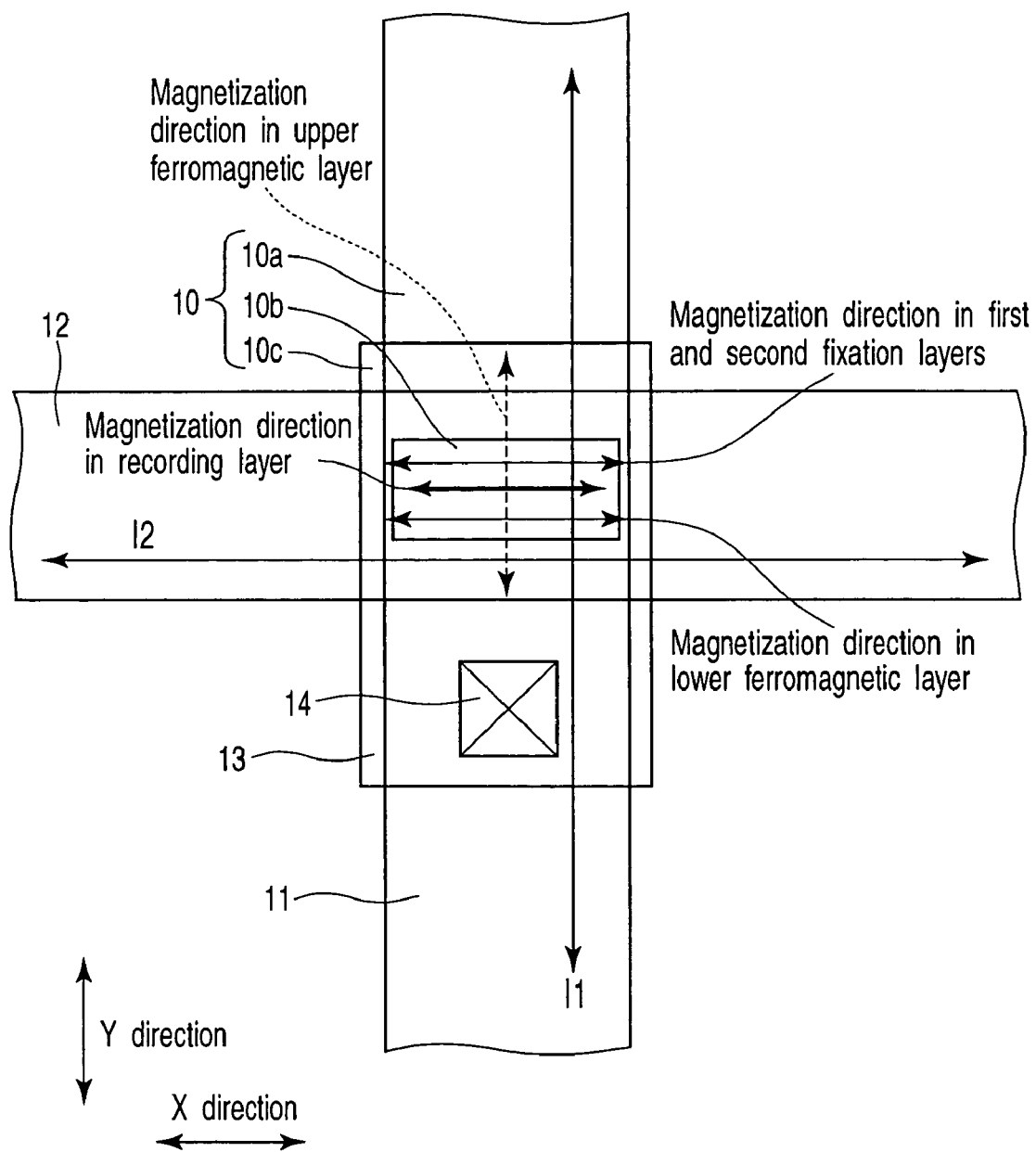
FIG. 3 is a diagram showing the magnetization direction of each layer in the magnetic random access memory according to the first embodiment of the present invention.

FIG. 1 is a schematic plan view showing a magnetic random access memory according to a first embodiment of the present invention. FIG. 2 is a sectional view of the magnetic random access memory taken along a line II—II in FIG. 1. FIG. 3 is a diagram showing the magnetization direction of each layer in the magnetic random access memory according to the first embodiment of the present invention. Description will be given of the structure of the magnetic random access memory according to the first embodiment.

As shown in FIGS. 1 and 2, a memory cell is shaped like a matrix in which bit lines (BL) 11 functioning as write and read wires are extended in a Y direction and word lines (WL) 12 functioning as write wires are extended in an X direction.

At least a part 10b of an MTJ element 10 that is a magneto-resistance element is provided in a P area that is a point of intersection of one bit line 11 and one word line which point is located between the bit line 11 and the word line 12. One end of the MTJ element 10 is electrically connected to the corresponding bit line 11. The other end of the MTJ element 10 is electrically connected to a lower electrode layer 13. The lower electrode layer 13 is electrically connected via a contact 14 to a MOSFET 15 that is a reading-switching element. A gate electrode of the MOSFET 15 functions as a read word line.

The MTJ element 10 is formed of an upper ferromagnetic layer 30, a nonmagnetic layer 31, a recording layer (free layer) 32, a tunnel barrier layer (nonmagnetic layer) 33, a first fixation layer (pin layer) 34, an antiferromagnetic layer 35, a second fixation layer 36, a nonmagnetic layer 37, and a lower ferromagnetic layer 38. The MTJ element 10 is composed of a first portion 10a, a second portion 10b, and a third portion 10c. The first portion 10a is composed of the upper ferromagnetic layer 30. The second portion 10b is composed of the nonmagnetic layer 31 and the recording layer 32. The third portion 10c is composed of the tunnel barrier layer 33, the first fixation layer 34, the antiferromagnetic layer 35, the second fixation layer 36, the nonmagnetic layer 37, and the lower ferromagnetic layer 38. In this MTJ element 10, the nonmagnetic layer 31 is provided between the recording layer 32 and the upper ferromagnetic layer 30. The nonmagnetic layers 33 and 37 are provided between the recording layer 32 and the lower ferromagnetic layer 38.

At least parts of the peripheries of the bit line 11 and word line 12 are surrounded by first and second yoke layers 21 and 22, respectively, each composed of a magnetic layer. For example, the first yoke layer 21 is formed on a top surface of the bit line 11 (the surface of the bit line 11 which is opposite its surface facing the MTJ element 10) and on both sides of the bit line 11. The second yoke layer 22 is formed on a top surface of the word line 12 (the surface of the word line 12 which is opposite its surface facing the MTJ element 10) and on both sides of the word line 12. Each of the first and second yoke layers 21 and 22 has an easy axis of magnetization extending in a longitudinal direction (Y direction). The easy axis of magnetization has uniaxial anisotropy.

In this memory cell, the recording layer 32, the upper ferromagnetic layer 30, and the lower ferromagnetic layer 38 has a magnetostriction constant with a large absolute value. Accordingly, data writes are carried out using a magnetostriction interaction. Here, the magnetostriction constant has an absolute value of, for example, at least $10^{-6}$. Further, the magnetostriction constant may be either positive or negative. If the magnetostriction constant is positive, magnetization is likely to be oriented in the direction of tensile stress. If the magnetostriction constant is negative, the magnetization is likely to be oriented in a direction perpendicular to the direction of tensile stress.

In a data write based on the magnetostriction interaction, a first stress resulting from magnetostriction induced in the upper ferromagnetic layer 30 is transmitted to the recording layer 32. Moreover, a second stress resulting from magnetostriction induced in the lower ferromagnetic layer 38 is transmitted to the recording layer 32. In this case, the first and second stresses desirably have similar magnitudes.

To allow the first and second stresses to easily rotate the magnetization in the recording layer 32, the film thickness T1 of the upper ferromagnetic layer 30, the film thickness T2 of the lower ferromagnetic layer 38, and the film thickness T3 of the recording layer 32 desirably satisfy the following relationship:

$$T1, T2 > T3 \quad (1)$$

Further, the ratio of energy A generated as a result of the uniaxial anisotropy of the recording layer 32 to composite energy B of the first and second stresses desirably satisfies the relationship in Equation (2). The magnitude of the energy can be adjusted by varying the materials and film thickness of the recording layer 32 and nonmagnetic layers 31, 33, and 37.

$$\text{energy A: energy B} = 1:2 \quad (2)$$

The width of the upper ferromagnetic layer 30 and lower ferromagnetic layer 38 is desirably equal to or larger than the width of each of the bit line 11 and word line 12.

The first yoke layer 21 and the bit line 11 are in contact with the upper ferromagnetic layer 30. The second yoke layer 22 and the word line 12 are not in contact with the lower ferromagnetic layer 38. However, the distance D between the lower electrode layer 13 and both second yoke layer 22 and word line 12 is small.

As shown in FIG. 3, the recording layer 32 has an easy axis of magnetization oriented in the longitudinal direction of the planar shape of the second portion 10b of the MTJ element 10. This easy axis of magnetization has uniaxial anisotropy.

The first portion 10a is extended in a Y direction similarly to the bit line 11. The second portion 10b is shaped like an island-like rectangle. The third portion 10c is larger than the second portion 10b and has the same planar shape as that of the lower electrode layer 13. Accordingly, the first to third portions 10a, 10b, and 10c have different planar shapes.

In this MTJ element 10, the magnetization direction of each layer is defined as described below. The magnetizations in the first and second fixation layers 34 and 36 are fixed to an orientation almost parallel to the direction (X direction) in which the word line 12 is extended. During no-current flow time, the magnetization in the recording layer 32 is oriented almost parallel to the direction (X direction) in which the word line 12 is extended. The magnetization in the upper ferromagnetic layer 30 is oriented almost parallel to the direction (Y direction) in which the bit line 11 is extended. The magnetization in the lower ferromagnetic layer 38 is oriented almost parallel to the direction (X direction) in which the word line 12 is extended.

In other words, during no-current flow time, the magnetization directions of the upper ferromagnetic layer 30 and lower ferromagnetic layer 38 are at 90° to each other so that the magnetization in the upper ferromagnetic layer 30 is perpendicular to the magnetization in the lower ferromagnetic layer 38. The magnetization in the recording layer 32 is parallel or antiparallel to the magnetization in one of the upper ferromagnetic layer 30 and lower ferromagnetic layer 38. In the present embodiment, during no-current flow time, the magnetization in the recording layer 32 is set to be parallel or antiparallel to the magnetization in the lower ferromagnetic layer 38. During no-current flow time, it is possible to orient the magnetization in the recording layer 32 almost parallel to the extending direction (Y direction) of the bit line 11.

The longitudinal direction of the planar shape of the lower ferromagnetic layer 38 corresponds to the extending direction (Y direction) of the bit line 11. Accordingly, the magnetization in the lower ferromagnetic layer 38 caused by the planar shape during no-current flow time may be considered to be in the Y direction. However, in the present embodiment, the lower ferromagnetic layer 38 is placed opposite the second fixation layer 36 via the nonmagnetic layer 37. Accordingly, by adjusting the material or film thickness of the nonmagnetic layer 37, a weakly magnetically coupled state can be created between the lower ferromagnetic layer 38 and the second fixation layer 36. Thus, during no-current flow time, the magnetization direction of the lower ferromagnetic layer 38 can be set to be parallel or antiparallel (X direction) to the magnetization direction of the second fixation layer 36 regardless of the planar shape of the lower ferromagnetic layer 38.

(2) Materials

The materials mentioned below are desirably used to form the layers constituting the MTJ element 10 as well as the first and second yoke layers 21 and 22.

The recording layer 32 and the fixation layers 34 and 36 are formed of, for example, Fe, Co, Ni, or their alloys, a magnetite having a large spin polarizability, an oxide such as $CrO_2$ or $RXMnO_{3-y}$ (R: rare earth, X: Ca, Ba, or Sr), or a Heusler alloy such as MiMnSb or PtMnSb. These magnetic substances may contain a small amount of a nonmagnetic element such as Ag, Cu, Au, Al, Mg, Si, Bi, Ta, B, C, O, N, Pd, Pt, Zr, Ir, W, Mo, or Nb unless they lose ferromagnetism.

The tunnel barrier layer 33 is formed of one of various dielectrics, for example, $Al_2O_3$, $SiO_2$, MgO, AlN, $Bi_2O_3$, $MgF_2$, $CaF_2$, $SrTiO_2$, and $AlLaO_3$.

The upper ferromagnetic layer 30 and the lower ferromagnetic layer 38 are formed of, for example, Fe, Co, Ni, or their alloy, a magnetite having a large spin polarizability, an oxide such as $CrO_2$ or $RXMnO_{3-y}$ (R: rare earth, X: Ca, Ba, or Sr), or a Heusler alloy such as MiMnSb or PtMnSb.

The nonmagnetic layers 31 and 37 are formed of one of various dielectrics, for example, $Al_2O_3$, $SiO_2$, MgO, AlN, $Bi_2O_3$, $MgF_2$, $CaF_2$, $SrTiO_2$, and $AlLaO_3$. Also the nonmagnetic layers 31 and 37 are formed of, for example, Ru, Ag, Cu, Au, Al, Mg, Si, Bi, Ta, B, C, O, N, Pd, Pt, Zr, Ir, W, Mo, or Nb.

The antiferromagnetic layer 35 is formed of, for example, Fe—Mn, Pt—Mn, Pt—Cr—Mn, Ni—Mn, Ir—Mn, NiO, or $Fe_2O_3$.

The first and second yoke layers 21 and 22 are formed of, for example, NiFe, CoFe, amorphous-CoZrNb, FeNx, or FeAlSi.

(3) Write/Read Operation

Description will be given of a write/read operation performed on the magnetic random access memory according to the first embodiment. In this case, the easy axis of magnetization of the recording layer 32 is assumed to be almost parallel to the extending direction (X direction) of the word line 12. Further, for simplification, all of the three layers including the recording layer 32, the upper ferromagnetic layer 30, and the lower ferromagnetic layer 38 are assumed to have positive magnetostriction constants. Of course, any of the three layers may have a negative magnetostriction constant. In that case, rotation through 90° may be assumed in the description below.

(a) Write Operation

FIGS. 4 to 9 are diagrams illustrating a write operation performed on the magnetic random access memory according to the first embodiment of the present invention.

The present embodiment is based on what is called toggle writes in which before data is written in a selected cell, data already present in the selected cell is read from the cell. Accordingly, if arbitrary data is to be written in a selected cell and when data already present in the selected cell is read from the cell to find that the arbitrary data has already been written in the cell, no writes are carried out. If it is found out that data different from the arbitrary data has been written in the cell, a write is carried out to rewrite the data. If for example, "0" data is to be written in the selected cell, when data already present in the selected cell is read from the cell and shows that "0" data has already been written in the selected cell, no writes are carried out. A write is carried out only if "1" data has already been written in the selected cell. Likewise, if "1" data is to be written in the selected cell, when data already present in the selected cell is read from the cell and shows that "1" data has already been written in the selected cell, no writes are carried out. A write is carried out only if "0" data has already been written in the selected cell.

If the data must be written in the selected cell after the above check cycle, corresponding two write wirings are sequentially turned on. The first turned-on write wiring is first turned off. Then, the second turned-on write wiring is turned off. For example, a four-cycle procedure comprises turning on the word line 12 and allowing a write current I2 to flow through the word line 12, turning on the bit line 11 and allowing a write current I1 to flow through the bit line 11, turning off the word line 12 to stop the flow of the write current I2, and turning off the bit line 11 to stop the flow of the write current I1.

This write operation will be specifically described below.

(Check Cycle)

First, it is checked what data is written in the MTJ element 10 in the selected cell. Thus, as in the case of a normal MRAM, the magnetizing resistance of the MTJ element 10 is read by turning on the MOSFET 15 to allow a read current to flow to the MTJ element 10 through the bit line 11. Specifically, if "0"1 data has already been written in the MTJ element 10, the magnetizations in the recording layer 32 and fixation layers 34 and 36 are, for example, parallel to each other. Accordingly, the resistance is low. On the other hand, if "1" data has already been written in the MTJ element 10, the magnetizations in the recording layer 32 and fixation layers 34 and 36 are, for example, antiparallel to each other. Accordingly, the resistance is high. Therefore, the data written in the MTJ element 10 is determined by reading the magnetic resistance, which may vary depending on whether "1" or "0" data has been written.

As a result, if the arbitrary data has already been written in the selected cell, no writes are carried out. If data different from the arbitrary data has already been written in the selected cell, a write is carried out to rewrite the data.

(Initial State)

As a result of the above check cycle, a write operation is required if (1) "1" data has already been written in the selected cell when "0" data is to be written in the selected cell or (2) "0" data has already been written in the selected cell when "1" data is to be written in the selected cell.

Accordingly, in the initial state, if "1" data has already been written in the MTJ element 10, the magnetization in the fixation layers 34 and 36 is oriented in the direction of 0°, whereas the magnetization in the recording layer 32 is oriented in the direction of 180°. The magnetization directions of these layers are in an antiparallel state (see the schematic diagram in FIG. 4A, showing magnetizations). On the other hand, if "0" data has already been written in the MTJ element 10, the magnetization in the fixation layers 34 and 36 is oriented in the direction of 0°, whereas the magnetization in the recording layer 32 is also oriented in the direction of 0°. The magnetization directions of these layers are in a parallel state (see the schematic diagram in FIG. 4A, showing magnetizations).

Figure 4:
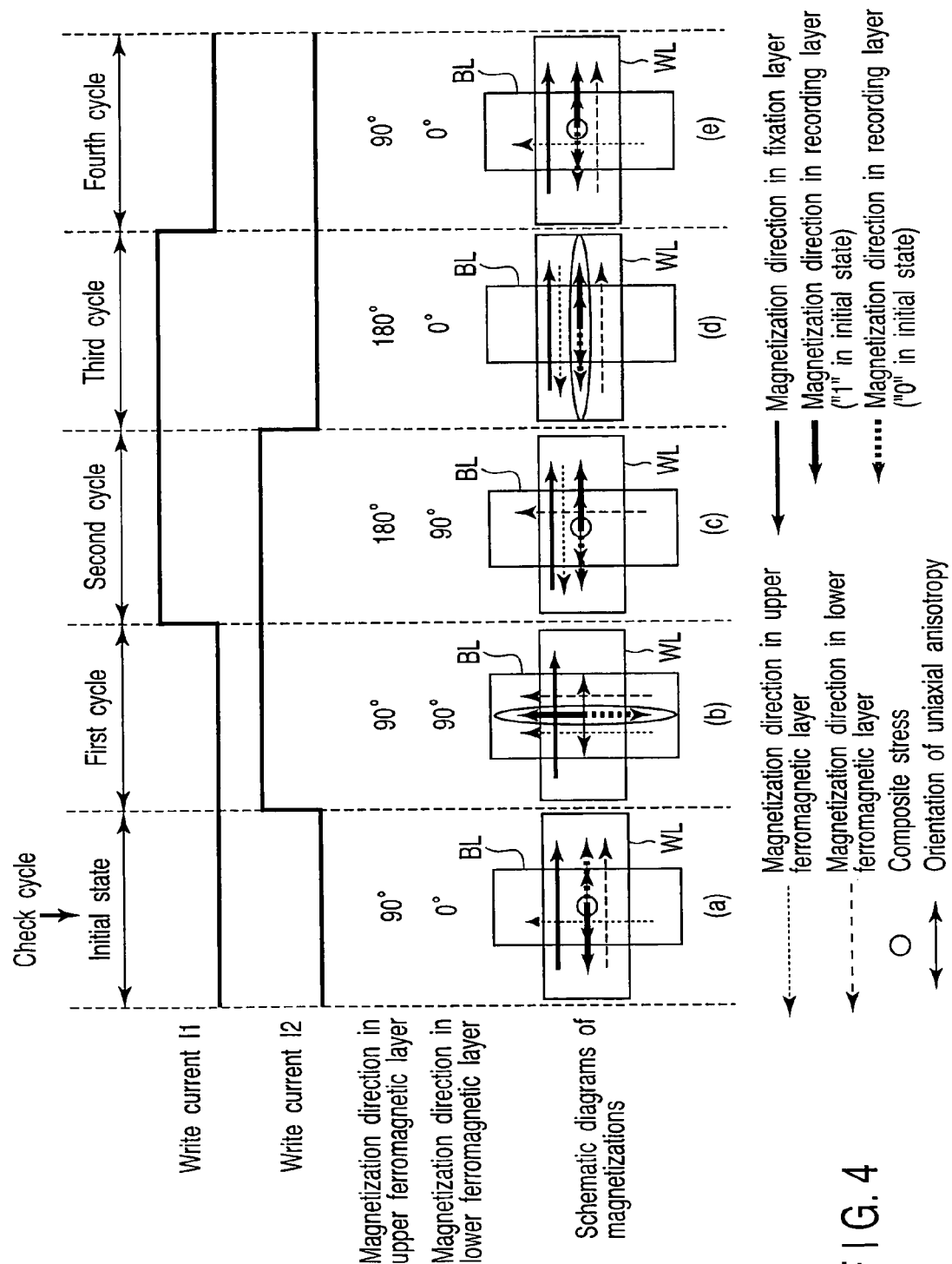
FIG. 4 is a diagram showing a data write to the magnetic random access memory according to the first embodiment of the present invention.

Furthermore, in the initial state, both bit line 11 and word line 12 are turned off as shown in FIG. 4. Thus, the write currents I1 and I2 do not flow through the bit line 11 and the word line 12, respectively. That is, the bit line 11 and the word line 11 are in a de-energized state. In this initial state, the magnetization in the upper ferromagnetic layer 30 is in the direction of 90°, whereas the magnetization in the lower ferromagnetic layer 38 is in the direction of 0°.

Figure 5:
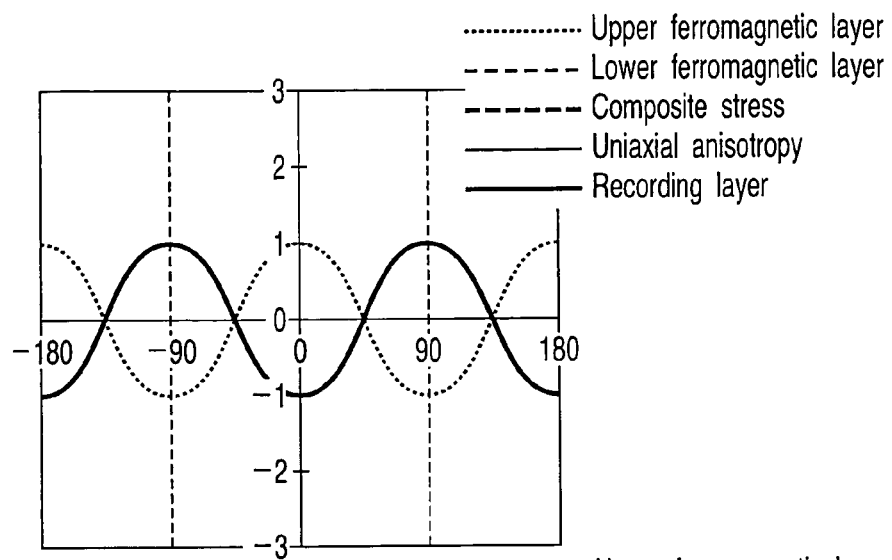
FIG. 5 is a diagram showing an initial state of the data write to the magnetic random access memory according to the first embodiment of the present invention.
Figure 6:
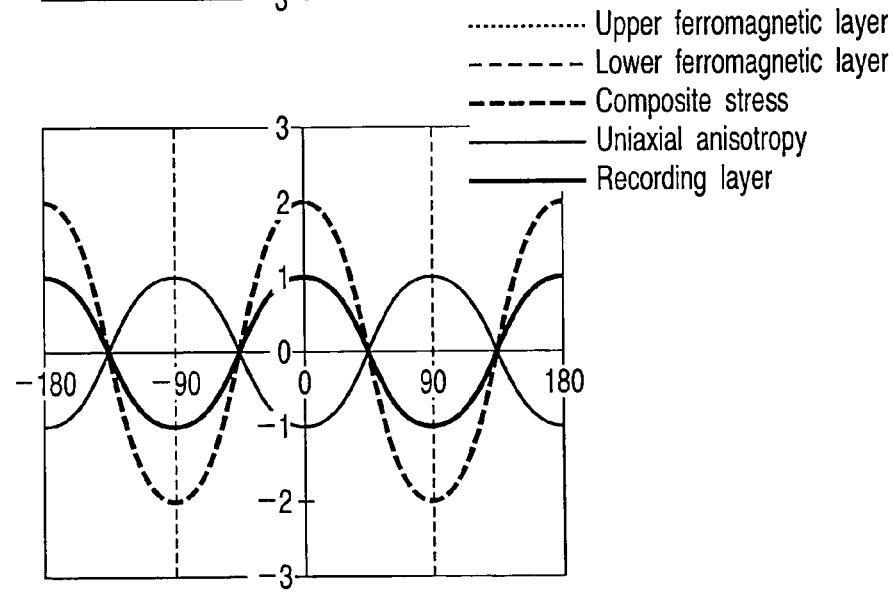
FIG. 6 is a diagram showing a first cycle of the data write to the magnetic random access memory according to the first embodiment of the present invention.
Figure 7:
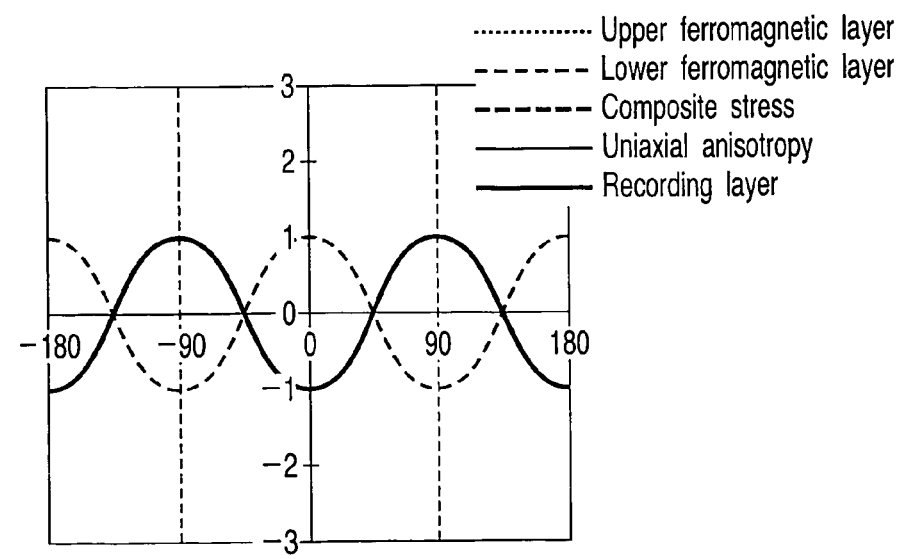
FIG. 7 is a diagram showing a second cycle of the data write to the magnetic random access memory according to the first embodiment of the present invention.
Figure 8:
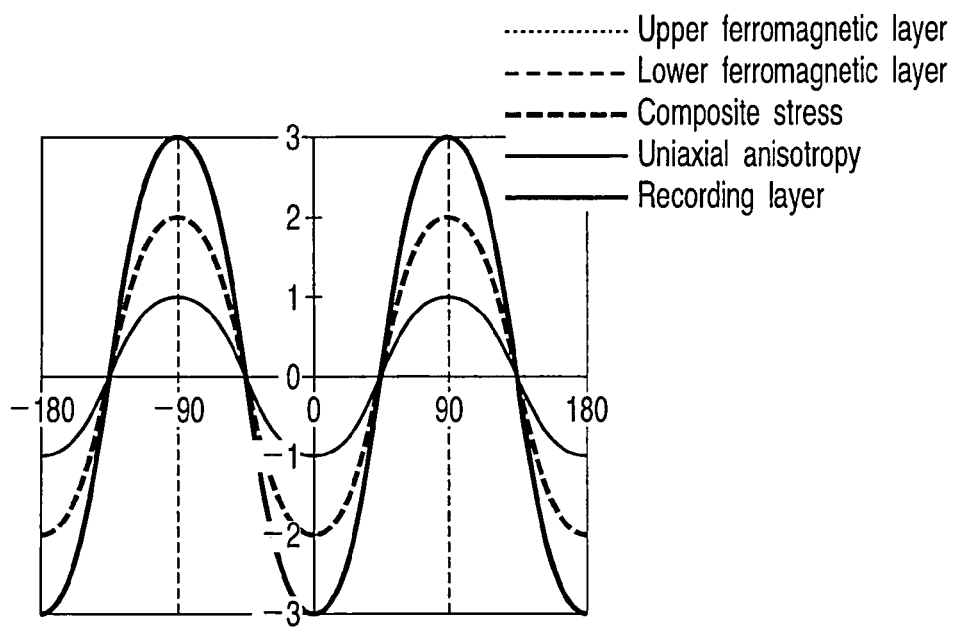
FIG. 8 is a diagram showing a third cycle of the data write to the magnetic random access memory according to the first embodiment of the present invention.
Figure 9:
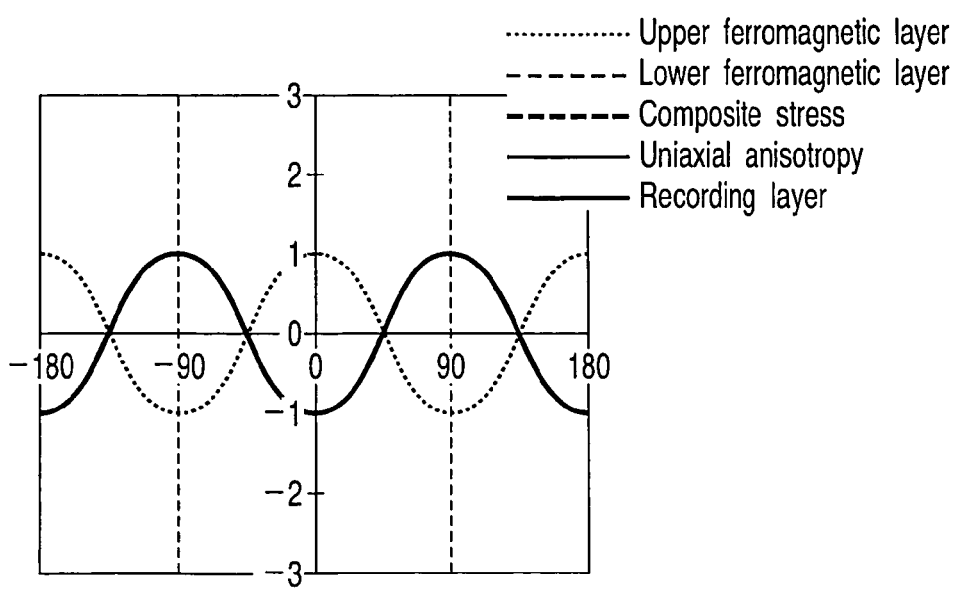
FIG. 9 is a diagram showing a fourth cycle of the data write to the magnetic random access memory according to the first embodiment of the present invention.

In this initial state, as shown in FIG. 5, the magnetic energies of the upper ferromagnetic layer 30 and lower ferromagnetic layer 38 have the same amplitude but different phases shifted from each other through 90°. The magnetic energies have maximum values at $-180°, -90°, 0°, 90°$, and 180°. The uniaxial anisotropic magnetic energy have a maximum value at $-180°, -90°, 0°, 90°$, and 180°. Further, in the initial state, the first stress acting on the recording layer 32 owing to the magnetostriction in the upper ferromagnetic layer 30 offsets the second stress applied to the recording layer 32 owing to the magnetostriction in the lower ferromagnetic layer 38. Consequently, the composite stress of the first and second stress is zero. Thus, the magnetic energy applied to the recording layer 32 has a maximum value similar to that of the uniaxial anisotropic magnetic energy.

(First Cycle)

Then, in a first cycle, as shown in FIG. 4, the bit line is kept off to hinder the write current I1 from flowing through the bit line 11. The word line 12 is turned on to allow the write current to flow through the word line 12. In this state, the magnetization in the upper ferromagnetic layer 30 remains in the direction of 90°. However, the magnetization in the lower ferromagnetic layer 38 is rotated and oriented in the direction of 90°. Consequently, the magnetizations in both layers 30 and 38 are oriented in the same direction.

Specifically, the second yoke layer 22 guides a magnetic field generated by the write current I2 flowing through the word line 12 to the lower ferromagnetic layer 38. As a result, the magnetization in the lower ferromagnetic layer 38 is rotated through 90 to shift the phase of the magnetic energy of the lower ferromagnetic layer 38 by 90° (see FIG. 6). Thus, the magnetic energy of the upper ferromagnetic layer 32 and the magnetic energy of the lower ferromagnetic layer 38 draw the same curve (the magnetizations in the upper and lower ferromagnetic layers 30 and 38 are oriented in the same direction). Since the sum of the first and second stresses acts on the recording layer 32, the composite stress increased in the directions of 90° and −90° acts on the recording layer 32 (see the schematic diagram in FIG. 4B, showing magnetizations). Thus, the magnetization in the recording layer 32 is rotated through 90° in the directions of the composite stress (the directions of 90° and −90°) (see the schematic diagram in FIG. 4B, showing magnetizations).

(Second Cycle)

Then, in a second cycle, as shown in FIG. 4, with the write current I2 kept flowing through the word line T2, the bit line 11 is turned on to allow the write current to flow through the bit line 11. In this state, the magnetization in the lower ferromagnetic layer 38 remains oriented in the direction of 90° The magnetization in the upper ferromagnetic layer 30 is rotated and oriented in the direction 180°.

Specifically, the first yoke layer 21 guides a magnetic field generated by the write current I1 flowing through the bit line 11, to the upper ferromagnetic layer 30. As a result, the magnetization in the upper ferromagnetic layer 30 is rotated through 90° to shift the phase of the magnetic energy of the upper ferromagnetic layer 30 by 90° (see FIG. 7). Thus, the magnetic energy of the upper ferromagnetic layer 30 and the magnetic energy of the lower ferromagnetic layer 38 have the same amplitude but different phases shifted from each other through 90° The first and second stresses are balanced, so that the composite stress is zero. As a result, the magnetization in the recording layer 32 is oriented in the direction of 180° to the initial state (see the schematic diagram in FIG. 4C, showing magnetizations).

(Third Cycle)

Then, in a third cycle, as shown in FIG. 4, with the write current I1 kept flowing through the bit line 11, the word line I2 is turned off to stop the flow of the write current I2. In this state, the magnetization in the upper ferromagnetic layer 30 remains oriented in the direction of 180° The magnetization in the lower ferromagnetic layer 38 returns to the direction of 0°, which corresponds to the original stable state.

That is, the magnetic field generated by the write current I2 flowing through the word line 12 is eliminated to prevent the application of a magnetic field to the magnetization in the lower ferromagnetic layer 38. This causes the magnetization in the lower ferromagnetic layer 38 to return to the direction of 0°, which corresponds to the original stable state. Consequently, the magnetization in the lower ferromagnetic layer 38 is rotated through 90° to shift the phase of the magnetic energy of the lower ferromagnetic layer 38 by 90° (see FIG. 8). Thus, the magnetic energy of the upper ferromagnetic layer 32 and the magnetic energy of the lower ferromagnetic layer 38 exhibit the same curve (the magnetizations in the upper and lower ferromagnetic layers 30 and 38 are oriented in the opposite directions). Since the sum of the first and second stresses acts on the recording layer 32, the composite stress increased in the directions of 0° and 180° acts on the recording layer 32 (see the schematic diagram in FIG. 4D, showing magnetizations). Thus, the magnetization in the recording layer 32 remains oriented in the directions of the composite stress (the directions of 0° and 180°) (see the schematic diagram in FIG. 4D, showing magnetizations).

(Fourth Cycle)

Then, in a fourth cycle, as shown in FIG. 4, the bit line 11 is turned off to stop the flow of the write current I1, as in the case of the word line 12. In this state, the magnetization in the lower ferromagnetic layer 38 remains oriented in the direction of 0°. The magnetization in the upper ferromagnetic layer 30 returns to the direction of 90°, which corresponds to the original stable state.

That is, the magnetic field generated by the write current I1 flowing through the bit line 11 is eliminated to prevent the application of a magnetic field to the magnetization in the upper ferromagnetic layer 30. This causes the magnetization in the upper ferromagnetic layer 30 to return to the direction of 90°, which corresponds to the original stable state. Consequently, the magnetization in the upper ferro-magnetic layer 30 is rotated through 90° (see the schematic diagram in FIG. 4E, showing magnetizations) to shift the phase of the magnetic energy of the upper ferromagnetic layer 30 by 90° (see FIG. 9). Thus, the magnetic energy of the upper ferromagnetic layer 30 and the magnetic energy of the lower ferromagnetic layer 38 have the same amplitude but different phases shifted from each other through 90°. The first and second stresses are balanced, so that the composite stress is zero. As a result, the magnetization in the recording layer 32 is not rotated but remains oriented in the directions of 0° and 180° (see the schematic diagram in FIG. 4E, showing magnetizations). As a result, "0" or "1" data is written in the MTJ element 10. The fourth cycle in FIG. 9 has the same magnetizing energy status as that in the initial state shown in FIG. 5.

As described above, when the write currents I1 and I2 are allowed to flow through the bit and word lines 11 and 12, respectively, the orientations of the magnetizations in the upper and lower ferromagnetic layers 30 and 38 are set to rotate through at least 45° (desirably about 90°) from the initial state. Then, the magnetostriction effect of the upper and lower ferromagnetic layers 30 and 38 strains the recording layer 32. The resultant adverse effect of the magnetostriction enables the magnetization in the recording layer 32 to be rotated. The above four cycles enable the magnetization in the recording layer 32 to be rotated from 0° to 180° or from 180° to 0°.

Regardless of whether "0" or "1" data is written, the write currents I1 and I2 are allowed to flow in the same direction.

(b) Read Operation

Figure 10:
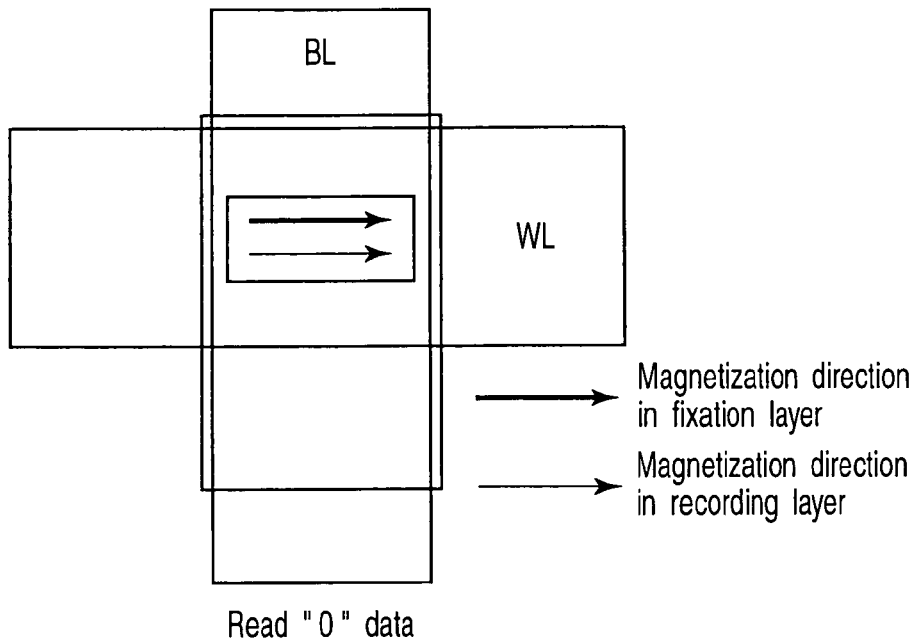
FIG. 10 is a schematic diagram showing a read of "0" data from the magnetic random access memory according to the first embodiment of the present invention.
Figure 11:
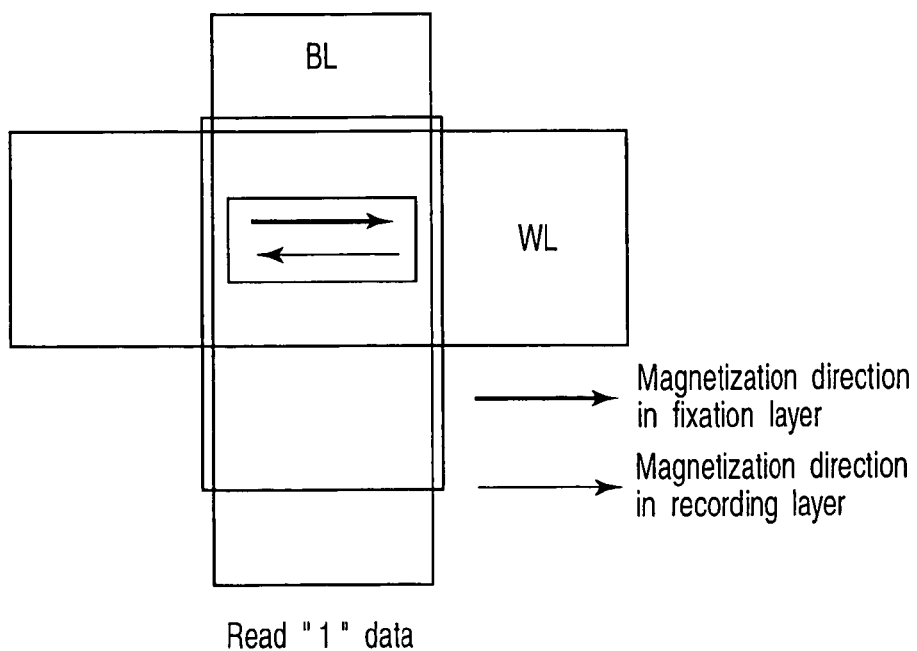
FIG. 11 is a schematic diagram showing a read of "1" data from the magnetic random access memory according to the first embodiment of the present invention.

FIGS. 10 and 11 schematically show that "1" and "0" data have been written in the magnetic random access memory according to the first embodiment of the present invention.

If "0" data has been written in the MTJ element 10, then the magnetization in the recording layer 32 is oriented parallel to the magnetization in the fixation layers 34 and 36, for example, as shown in FIG. 10. On the other hand, if "1" data has been written in the MTJ element 10, then the magnetization in the recording layer 32 is oriented antiparallel to the magnetization in the fixation layers 34 and 36, for example, as shown in FIG. 11.

In this state, to read the written data, the MOSFET 15 is turned on to allow a read current to flow to the MTJ element 10 through the bit line 11 to read the magnetizing resistance of the MTJ element 10, as in the case of normal MRAMs. Specifically, if "0" data has been written, the magnetization in the recording layer 32 is parallel to the magnetization in the fixation layers 34 and 36. Accordingly, the resistance is low. On the other hand, if "1" data has been written, the magnetization in the recording layer 32 is antiparallel to the magnetization in the fixation layers 34 and 36. Accordingly, the resistance is high. Therefore, the data written in the MTJ element 10 is determined by reading the magnetic resistance, which may vary depending on whether "1" or "0" data has been written.

When the read current is allowed to flow through the MTJ element 10, a self-reference read can be carried out by also allowing a current to flow through the word line 12 to rotate the magnetization in the lower ferromagnetic layer 38 to increase or reduce the resistance of the MTJ element 10 and then sensing the increased or reduced resistance.

According to the first embodiment, the upper ferromagnetic layer 30 and the lower ferromagnetic layer 38 are provided over and under the recording layer 32, respectively, via the nonmagnetic layers 31, 33, and 37. The recording layer 32, the upper ferromagnetic layer 30, and the lower ferromagnetic layer 38 have large magnetostriction constants. Thus, when a data write is carried out, the magnetization in the recording layer 32 is rotated by transmitting, to the recording layer 32, the first and second stresses resulting from the magnetostriction of the upper and lower ferromagnetic layers 30 and 38, caused by the magnetic fields generated by the write currents I1 and I2.

For such a data write, a closed magnetic circuit is formed of the yoke layer 21, provided around the bit line 11, and the upper ferromagnetic layer 30. A magnetic circuit with a small width is formed of the yoke layer 22, provided around the word line 12, and the lower ferromagnetic layer 38. Accordingly, these magnetic circuits enable the magnetic fields generated by the write currents I1 and I2 to be guided to the upper and lower ferromagnetic layers 30 and 38. Thus, the magnetizations in the upper and lower ferromagnetic layers 30 and 38 can be rotated using relatively small write currents I1 and I2. This makes it possible to reduce the write currents I1 and I2.

Further, these magnetic circuits enable the magnetic fields generated by the write currents I1 and I2 to be efficiently guided to the upper and lower ferromagnetic layers 30 and 38. Consequently, disturbance (erroneous writes to semi-selected cells) can be suppressed.

Furthermore, when data is written in the recording layer 32 on the basis of the magnetostriction interaction between the recording layer 32 and both upper and lower ferromagnetic layers 30 and 38, it is possible to reduce a possible variation in the reversal of the magnetization in the recording layer 32 attributed to the roughness of the end of the element compared to the direct write of data in the recording later 32 utilizing current magnetic fields.

Second Embodiment

A second embodiment is obtained by deforming the structure of a third portion of the MTJ element according to the first embodiment.

Figure 12:
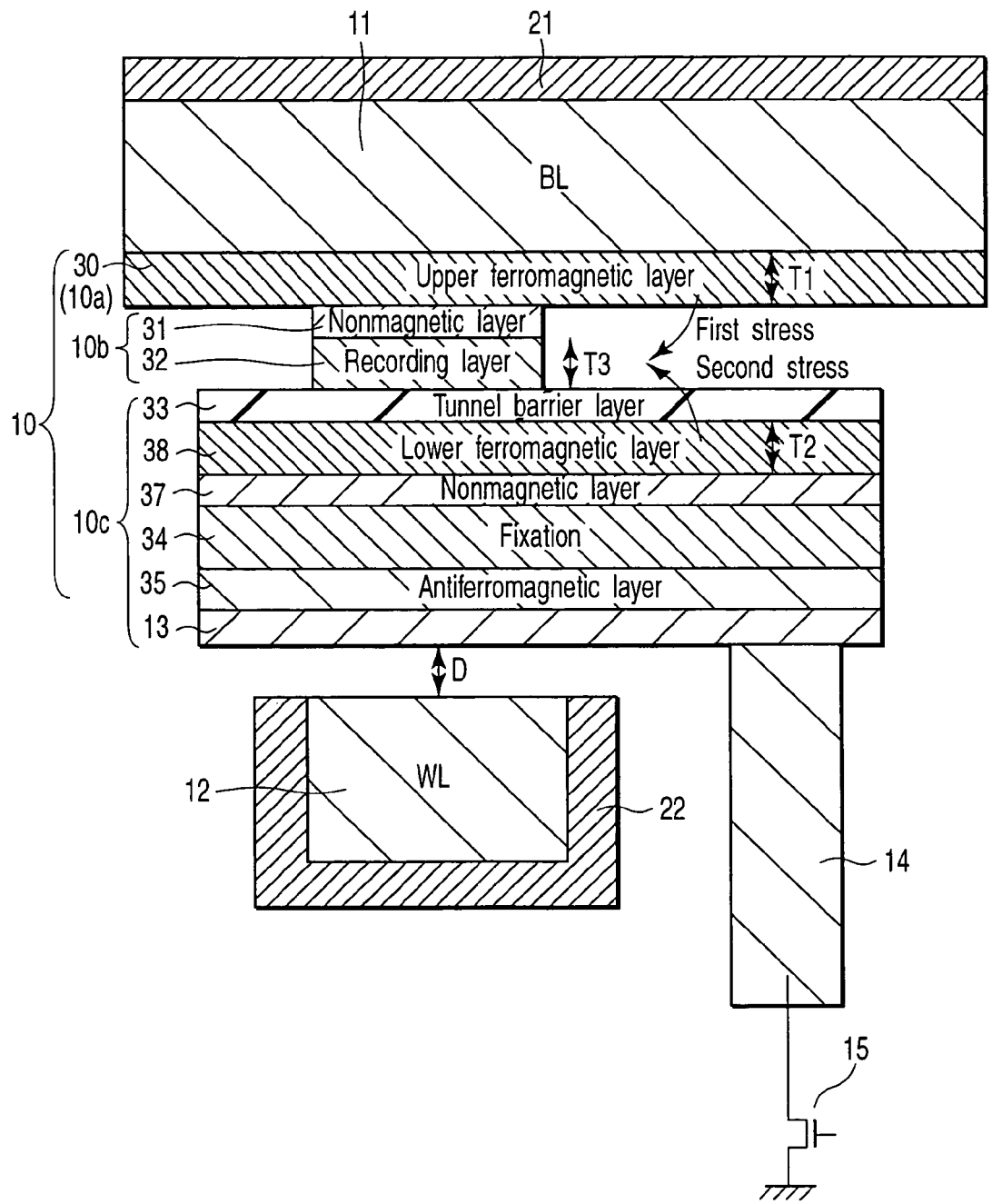
FIG. 12 is a schematic plan view showing a magnetic random access memory according to a second embodiment of the present invention.

FIG. 12 is a schematic sectional view of a magnetic random access memory according to a second embodiment of the present invention. Description will be given below of the structure of the magnetic random access memory according to the second embodiment.

As shown in FIG. 12, the second embodiment differs from the first embodiment in a third portion 10c of the MTJ element 10. The third portion 10c is composed of the tunnel barrier layer 33, the lower ferromagnetic layer 38, the nonmagnetic layer 37, the fixation layer 34, and the antiferromagnetic layer 35, which are arranged in this order in the vertical direction; the tunnel barrier layer 33 is located under the recording layer 32. Accordingly, the nonmagnetic layer 31 is provided between the recording layer 32 and the upper ferromagnetic layer 30. The nonmagnetic layer (tunnel barrier layer) 33 is provided between the recording layer 32 and the lower ferromagnetic layer 38.

Also in this structure, as in the case of the first embodiment, a data write based on magnetostriction interaction is carried out by transmitting the first stress resulting from the magnetostriction induced in the upper ferromagnetic layer 30 to the recording layer 32 and transmitting the second stress resulting from the magnetostriction induced in the lower ferromagnetic layer 38 to the recording layer 32.

The magnetization in the fixation layer 34 is fixed in an orientation almost parallel to the direction (X direction) in which the word line 12 is extended. During no-current flow time, the magnetization in the recording layer 32 is oriented almost parallel to the extending direction (X direction) of the word line 12. The magnetization in the upper ferromagnetic layer 30 is oriented almost parallel to the extending direction (Y direction) of the bit line 11. The magnetization in the lower ferromagnetic layer 38 is oriented almost parallel to the extending direction (X direction) of the word line 12.

The longitudinal direction of the planar shape of the lower ferromagnetic layer 38 corresponds to the extending direction (Y direction) of the bit line 11. Accordingly, the magnetization direction of the lower ferromagnetic layer 38 attributed to the planar shape during no-current flow time is also considered to be the Y direction. However, in the present embodiment, the lower ferromagnetic layer 38 is placed opposite the fixation layer 34 via the nonmagnetic layer 37. Accordingly, a weakly magnetically coupled state can be created between the lower ferromagnetic layer 38 and the fixation layer 34 by adjusting the material or film thickness of the nonmagnetic layer 37. Thus, the magnetization direction of the lower ferromagnetic layer 38 during no-current flow time can be set to be parallel or antiparallel (X direction) to the magnetization direction of the fixation layer 34 regardless of the planar shape of the lower ferromagnetic layer 38.

The second embodiment can produce effects similar to those of the first embodiment. Moreover, in the second embodiment, the lower ferromagnetic layer 38 and the recording barrier 32 are separated from each other only via the tunnel barrier layer 33. Consequently, the stress induced by the lower ferromagnetic layer 38 acts more directly on the recording layer than that in the first embodiment. Thus, the stress to be generated by the lower ferromagnetic layer 38 on the basis of the adverse effect of magnetostriction is more reliably transmitted to the recording layer 32. Therefore, a reliable write operation can be accomplished.

Third Embodiment

In a third embodiment, gaps are formed around MTJ elements in order to relax the impact, on the MTJ elements, of the magnetostriction caused by an interlayer insulating film.

Figure 13:
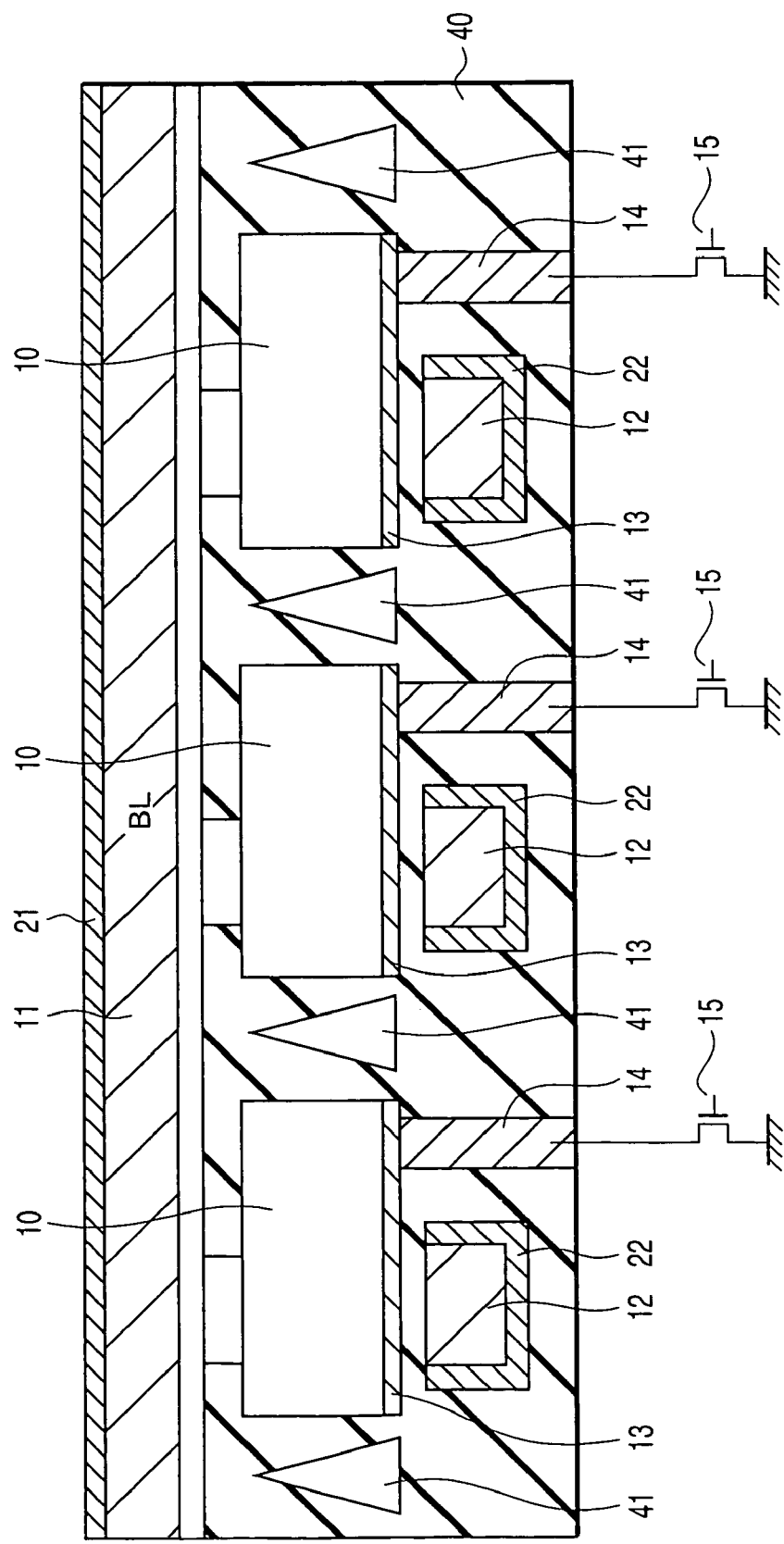
FIG. 13 is a schematic plan view showing a magnetic random access memory according to a third embodiment of the present invention.

FIG. 13 is a schematic sectional view of a magnetic random access memory according to a third embodiment of the present invention. Description will be given below of the structure of the magnetic random access memory according to the third embodiment.

As shown in FIG. 13, the third embodiment differs from the first embodiment in that gaps 41 are formed in an interlayer insulating film 40 provided around the MTJ elements 10. The gaps 41 may be formed anywhere within the interlayer insulating film 40. However, the gaps 41 are desirably formed near the MTJ elements, notably their recording layers 32.

The third embodiment produces effects similar to those of the first embodiment. Moreover, according to the third embodiment, the gaps 41 are formed around the MTJ elements 10 in the interlayer insulating film 40. This makes it possible to relax the impact, on the MTJ elements 10, of the stress induced by the interlayer insulating film.

Fourth Embodiment

According to a fourth embodiment, a metal film is provided between a ferromagnetic layer and a write wiring in order to relax the impact, on the MTJ element, of the stress induced by the write wiring.

Figure 14:
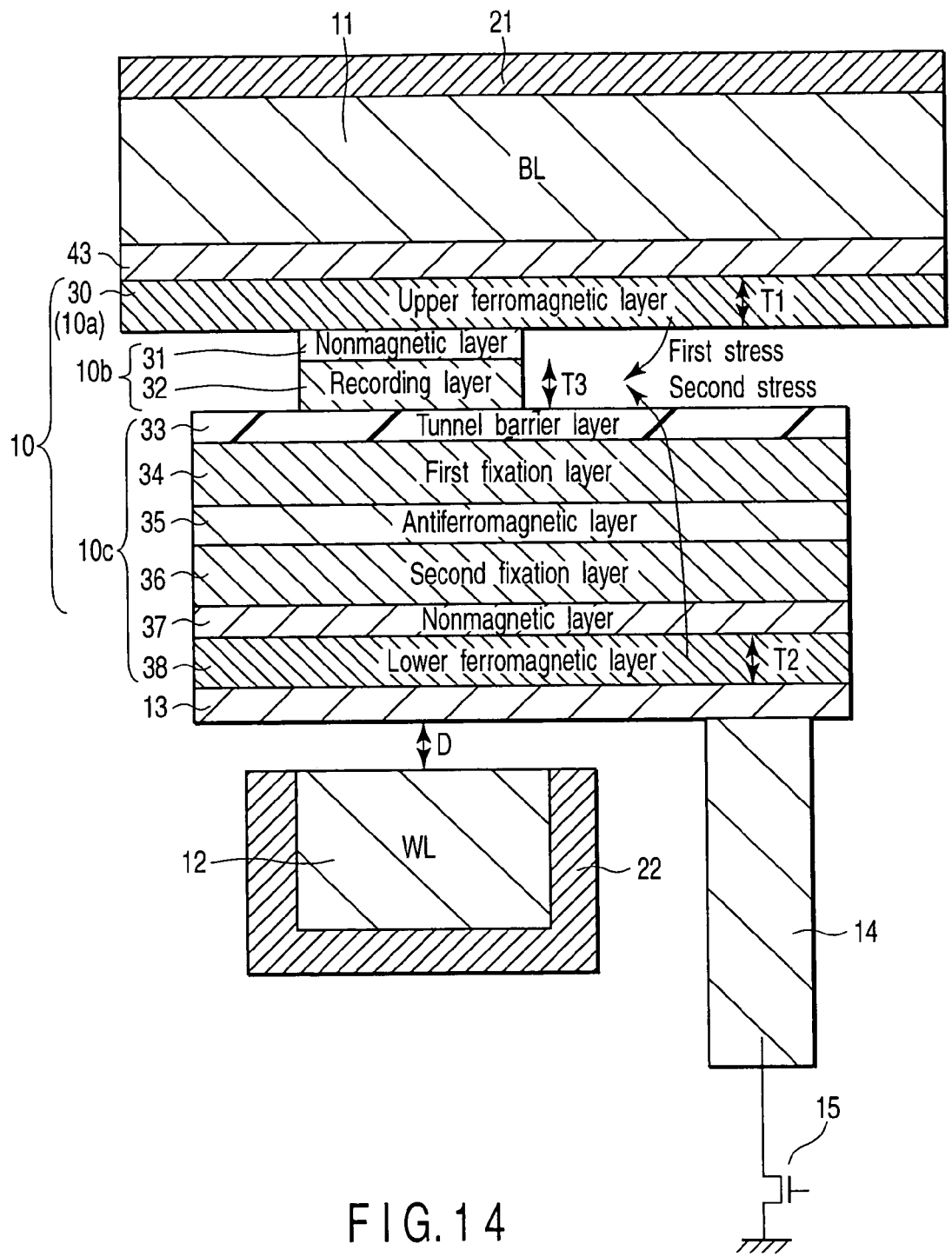
FIG. 14 is a schematic plan view showing a magnetic random access memory according to a fourth embodiment of the present invention.

FIG. 14 is a schematic sectional view of a magnetic random access memory according to a fourth embodiment of the present invention. Description will be given below of the structure of the magnetic random access memory according to the fourth embodiment.

As shown in FIG. 14, the fourth embodiment differs from the first embodiment in that a metal film 43 is provided between the upper ferromagnetic layer 30 and the bit line 11. The metal film 43 is desirably formed of, for example, a soft metal material such as aluminum.

The fourth embodiment produces effects similar to those of the first embodiment. Moreover, the metal film 43 is provided between the upper ferromagnetic layer 30 and the bit line 11. This serves to relax the impact, on the MTJ element 10, of the stress induced by the bit line 11.

Additionally, the present invention is not limited to the above embodiments. In implementation, the embodiments may be varied as described below without departing from the spirit of the invention.

(1) In the above embodiments, the memory cell has a 1 MTJ+1 Tr (transistor) structure. However, the present invention is not limited to this aspect. For example, in place of the transistor, a diode may be used as a reading-switching element. Alternatively, a cross-point structure may be used which does not use a reading switching element for each cell.

(2) In the above embodiments, the recording layer 32 and the fixation layers 34 and 36 have a single layer structure but may have a stacked structure. Further, in the above embodiments, the fixation layer 36 has a single layer structure but may have a weakly coupled stacked pin structure.

(3) In the above embodiments, a write operation is preformed in four cycles. However, the cycles may be allowed to overlap one another to reduce they number. For example, the first and second cycles may be executed simultaneously.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory comprising:
   a first write wiring extended in a first direction;
   a second write wiring extended in a second direction different from the first direction;
   a magneto-resistance element provided at a point of intersection of the first and second write wirings and located between the first and second write wirings;
   a first yoke layer provided on a first outer surface and both sides of the first write wiring and being formed of a magnetic layer, the first outer surface being opposite a first inner surface of the first write wiring facing the magneto-resistance element; and
   a second yoke layer provided on a second outer surface and both sides of the second write wiring and being formed of a magnetic layer, the second outer surface being opposite a second inner surface of the second write wiring facing the magneto-resistance element,
   wherein the magneto-resistance element has:
   a recording layer formed of a ferromagnetic substance and comprising a first surface and a second surface;
   a first ferromagnetic layer provided on the first surface of the recording layer;
   a second ferromagnetic layer provided on the second surface of the recording layer;
   a first nonmagnetic layer provided between the recording layer and the first ferromagnetic layer; and
   a second nonmagnetic layer provided between the recording layer and the second ferromagnetic layer.

2. The magnetic random access memory according to claim 1, wherein each of the recording layer and first and second ferromagnetic layers has a magnetostriction constant with an absolute value of at least $10^{-6}$.

3. The magnetic random access memory according to claim 1, wherein the recording layer has an easy axis of magnetization oriented in the first or second direction during no-current flow time.

4. The magnetic random access memory according to claim 1, wherein
   the first ferromagnetic layer is formed of a ferromagnetic substance having magnetization oriented parallel to the first direction during no-current flow time and applies a first stress resulting from magnetostriction, to the recording layer, and
   the second ferromagnetic layer is formed of a ferromagnetic substance having magnetization oriented parallel to the second direction during no-current flow time and applies a second stress resulting from magnetostriction, to the recording layer.

5. The magnetic random access memory according to claim 1, wherein each of the first and second ferromagnetic layers has a larger film thickness than the recording layer.

6. The magnetic random access memory according to claim 1, wherein each of the first and second ferromagnetic layers have a width equal to or larger than that of each of the first and second write wirings.

7. The magnetic random access memory according to claim 1, wherein the first or second nonmagnetic layer is a tunnel barrier layer.

8. The magnetic random access memory according to claim 1, wherein the magneto-resistance element further has:
   a first fixation layer provided between the second nonmagnetic layer and the second ferromagnetic layer;
   a second fixation layer provided between the second nonmagnetic layer and the second ferromagnetic layer and magnetically coupled to second ferromagnetic layer;
   a third nonmagnetic layer provided between the second ferroelectric layer and the second fixation layer; and
   an antiferromagnetic layer provided between the first and second fixation layers.

9. The magnetic random access memory according to claim 1, wherein the magneto-resistance element further has:
   a fixation layer provided between the second nonmagnetic layer and second write wiring and magnetically coupled to second ferromagnetic layer;
   a third nonmagnetic layer provided between the second ferroelectric layer and the fixation layer; and
   an antiferromagnetic layer provided between the fixation layer and the second write wiring.

10. The magnetic random access memory according to claim 1, further comprising an interlayer insulating film provided around the magneto-resistance element and having gap.

11. The magnetic random access memory according to claim 1, further comprising a metal layer provided between first write wiring and the first ferromagnetic layer.

12. A method of writing data in a magnetic random access memory comprising:
    a first write wiring extended in a first direction;
    a second write wiring extended in a second direction different from the first direction;
    a magneto-resistance element provided at a point of intersection of the first and second write wirings and located between the first and second write wirings;
    a first yoke layer provided on a first outer surface and both sides of the first write wiring and being formed of a magnetic layer, the first outer surface being opposite a first inner surface of the first write wiring facing the magneto-resistance element; and a second yoke layer provided on a second outer surface and both sides of the second write wiring and being formed of a magnetic layer, the second outer surface being opposite a second inner surface of the second write wiring facing the magneto-resistance element, the magneto-resistance element having:

a recording layer formed of a ferromagnetic substance and comprising a first surface and a second surface;

a first ferromagnetic layer provided on the first surface of the recording layer;

a second ferromagnetic layer provided on the second surface of the recording layer;

a first nonmagnetic layer provided between the recording layer and the first ferromagnetic layer; and a second nonmagnetic layer provided between the recording layer and the second ferromagnetic layer wherein when data is written in the magneto-resistance element, first and second write currents flow through the first and second write wirings, respectively, to generate first and second magnetic fields, respectively, the first and second magnetic fields are applied to the first and second ferromagnetic layers, respectively, to rotate the magnetizations in the first and second ferromagnetic layers, and a rotation of the magnetizations in the first and second ferromagnetic layers causes magnetostriction resulting in the first and second stresses, the first and second stresses being applied to the recording layer to rotate magnetization in the recording layer.

13. The method of writing data according to claim 12, wherein the first and second write wirings are sequentially turned on, and the first and second write wirings are then sequentially turned off, and one of the first and second write wirings turned on first is turned off first.

14. The method of writing data according to claim 12, wherein the first yoke layer guides the first magnetic field to the first ferromagnetic layer, and the second yoke layer guides the second magnetic field to the second ferromagnetic layer.

15. The method of writing data according to claim 12, wherein before data is written in the magneto-resistance element, data already present in the magneto-resistance element is read.

16. The method of writing data according to claim 12, wherein the first and second write currents flow in the same direction regardless of whether "0" data or "1" data is written.

17. The method of writing data according to claim 12, wherein each of the recording layer and first and second ferromagnetic layers has a magnetostriction constant with an absolute value of at least $10^{-6}$.

18. The method of writing data according to claim 12, wherein the recording layer has an easy axis of magnetization oriented in the first or second direction during no-current flow time.

19. The method of writing data according to claim 12, wherein the first ferromagnetic layer is formed of a ferromagnetic substance having magnetization oriented parallel to the first direction during no-current flow time and applies a first stress resulting from magnetostriction, to the recording layer, and the second ferromagnetic layer is formed of a ferromagnetic substance having magnetization oriented parallel to the second direction during no-current flow time and applies a second stress resulting from magnetostriction, to the recording layer.

20. The method of writing data according to claim 12, wherein the first or second nonmagnetic layer is a tunnel barrier layer.

* * * * *